United States Patent
Cheng et al.

(10) Patent No.: US 8,488,284 B2
(45) Date of Patent: Jul. 16, 2013

(54) TRANSFORMER FAILURE ANALYSIS SYSTEM

(75) Inventors: Chien-Lung Cheng, Yunlin County (TW); Shyi-Ching Chern, Yunlin County (TW); Jim-Chwen Yeh, Yunlin County (TW); Yi-Hung Lan, Yunlin County (TW); Chen-Chang Yang, Yunlin County (TW)

(73) Assignee: National Formosa University, Yunlin County (TW)

( * ) Notice: Subject to any disclaimer, the term of this patent is extended or adjusted under 35 U.S.C. 154(b) by 185 days.

(21) Appl. No.: 13/042,521

(22) Filed: Mar. 8, 2011

(65) Prior Publication Data

US 2011/0216450 A1    Sep. 8, 2011

(30) Foreign Application Priority Data

Mar. 8, 2010  (TW) ............................... 99106678 A

(51) Int. Cl.
*H02H 7/04*    (2006.01)
(52) U.S. Cl.
USPC ............................................. 361/35

(58) Field of Classification Search
USPC ............................................. 361/35
See application file for complete search history.

(56) References Cited

U.S. PATENT DOCUMENTS

| | | | | |
|---|---|---|---|---|
| 3,618,580 A * | 11/1971 | Dogadko et al. | ............. | 123/598 |
| 5,077,486 A * | 12/1991 | Marson et al. | ................ | 205/728 |
| 5,627,415 A * | 5/1997 | Charpentier et al. | ......... | 307/116 |
| 2004/0001292 A1 * | 1/2004 | Vanderkolk | ..................... | 361/42 |
| 2004/0264094 A1 * | 12/2004 | Rahman et al. | ............... | 361/115 |
| 2010/0039737 A1 * | 2/2010 | Koshizuka et al. | ............. | 361/36 |

* cited by examiner

*Primary Examiner* — Jared Fureman
*Assistant Examiner* — Kevin J Comber
(74) *Attorney, Agent, or Firm* — Bacon & Thomas, PLLC

(57) ABSTRACT

A transformer failure analysis system using a programmable chip in conjunction with a shock response spectrum analysis method to distinguish inrush current and fault current of a transformer and to monitor the phase of an AC power source inputting to the transformer by a phase detector. When an inrush current occurs, the programmable chip provides a control signal to delay the phase of the AC power source being inputted into the transformer, thereby suppressing the occurrence of the inrush current. When a fault current occurs, the control signal cuts off the AC power source from the transformer until the operator has tested the whole circuit architecture to debug and correct circuit application and eliminated the internal fault.

13 Claims, 8 Drawing Sheets

TRANSFORMER FAILURE ANALYSIS SYSTEM

BACKGROUND OF THE INVENTION

1. Field of the Invention

The present invention relates to circuit protection technology of a transformer and more particularly, to a transformer failure analysis system.

2. Description of the Related Art

A transformer is an important power transmission and distribution equipment in a power system. Therefore, it is necessary to protect the operation of the transformer in a power system and to maintain its stability. However, when a power system applies a voltage to the transformer thereof, inrush current, i.e., transient over-current and over-voltage may occur due to magnetic saturation of the transformer iron cores. The inrush current may be 5~10 times or more over the rated current, and will be attenuated to normal excitation current after several cycles or more than one minute. It causes impact and an adverse effect to the service life of related circuit components, and may be erroneously judged by a conventional suppress circuit to be a fault current of a short circuit. In this case, the suppress circuit will trip off the whole circuit, resulting in waste of time and labor in security examination and delay of normal production. When compared internal fault current with inrush current, inrush current has a large amount of waveform distortion of high harmonic components and even harmonics.

According to current power system protection circuits, recognition between an inrush current and a fault current recognition is done subject to the rule that when the second harmonic wave is over a predetermined rate relative to the fundamental wave (normally 17%), the current is determined to be an inrush current and the suppression protection circuit trips off the circuit; when the fundamental wave is higher than the rated current, the current is determined to be a fault current and the suppression protection circuit trips off the circuit within one cycle to protect the circuit and to avoid a malfunction. Thus, the aforesaid prior art technique avoids the protection circuit from a malfunction upon an inrush current, however the related circuit components must receive the impact of the over-voltage of several cycles of harmonic resonance and inrush current, affecting the service life and safety level of the whole circuit.

Further, conventional harmonic wave analysis is based on a periodic signal to analyze the waveform after fast Fourier transformation (FFT). However, because a transformer inrush current is a transient high harmonic signal, the analysis result is neither accurate nor reasonable, causing a blind point in protection circuit design and transformer protection ineffectiveness. Further, following the market trend to increase transformer capacity and to use high flux silicon steel for iron core, it can be seen that the value of the inrush current becomes relatively greater, the waveform distortion rate becomes relatively smaller and the second harmonic ratio becomes relatively lower. On the other hand, increase of system static capacitance subject to enlargement of ultra-high voltage system and increase of phase modulation equipment causes increase of the distortion rate of the waveform of the fault current in the circuit, complicating discrimination between fault current and inrush current.

SUMMARY OF THE INVENTION

The present invention has been accomplished under the circumstances in view. It is the main object of the present invention to provide a transformer failure analysis system, which effectively judges inrush current and fault current and rapidly provides an inrush over-voltage protection, improving the power-sourcing safety and stability of the transformer.

To achieve this and other objects of the present invention, a transformer failure analysis system comprises a controller, a sensing device, a phase detector and a programmable chip. The controller comprises a trigger circuit and a current-conducting switch. The trigger circuit is adapted to provide a DC signal to the current-conducting switch to turn on the current-conducting switch. The current-conducting switch is electrically connected with an AC power source. When the current-conducting switch is turned on, it inputs the AC power source into the primary winding of the transformer. When the controller initially conducts the AC power source to input a voltage into the transformer, the sensing device detects the current and voltage at the primary winding of the transformer, and outputs a current signal to the programmable chip. When the programmable chip detected an inrush current at the primary winding of the transformer, it, by means of the phase sensing signal detected by the phase detector, provides a first control signal carrying an intermittent trigger potential to the trigger circuit to reset the current-conduction switch of the controller, delaying the phase of the AC power source that is inputted into the primary winding of the transformer corresponding to the phase of the AC power source. When detected a fault current at the primary winding of the transformer, the programmable chip outputs a second control signal to the trigger circuit to stop the trigger circuit from inputting the DC signal into the current-conduction switch of the controller, and the controller will be electrically conducted by the trigger potential to input the AC power source only after the operator has tested the whole circuit architecture and eliminated the trouble. Thus, the inrush current at the transformer is suppressed, assuring transformer operation safety and stability. Real-time monitoring of inrush current suppression is the realization of a transformer protection system. It avoids unnecessary loss of electric fault, indirectly enhances the productivity and running economy.

The transformer failure analysis system can be used for monitoring the input current and voltage of a three-phase transformer. In this case, the controller comprises three current-conducting switches. When these three current-conducting switches are turned on, they signaling three respective AC power sources into the primary winding of the respective transformer of the three-phase transformer. These three AC power sources have 120 degrees phase difference. The sensing device is electrically connected with the current-conducting switches, and adapted for outputting the current signal to the programmable chip subject to the current and voltage at the primary winding of each of the three transformers of the three-phase transformer. When the programmable chip detected a fault current at the primary winding of one of the three transformers of the three-phase transformer, it outputs a second control signal. The first control signal is for turning on the trigger circuit to input the DC signal into the current-conducting switches. The second control signal is for stopping the trigger circuit from inputting the DC signal into the current-conducting switches.

DETAILED DESCRIPTION OF THE INVENTION

Figure 1:
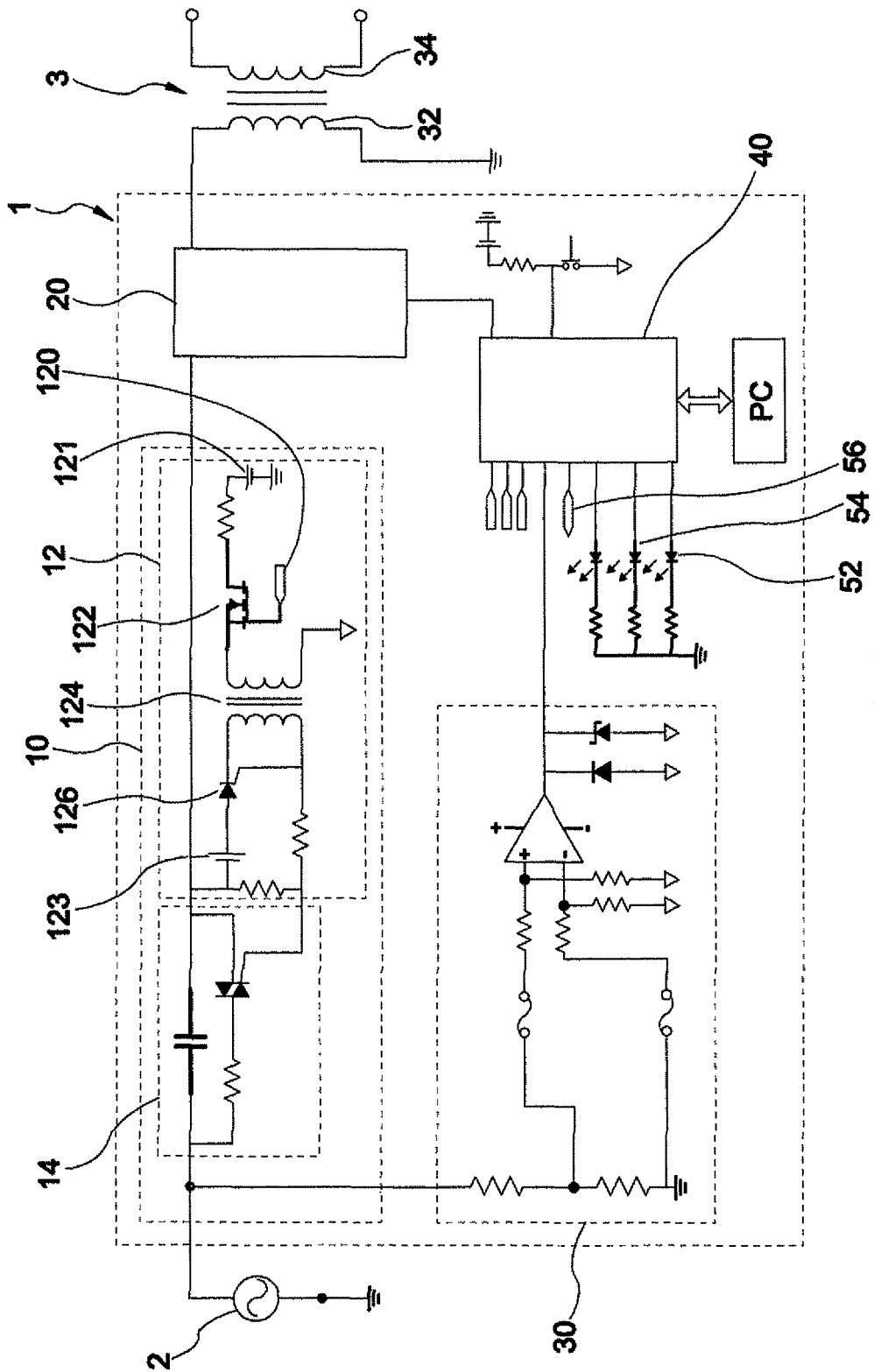
FIG. 1 is a circuit diagram of a transformer failure analysis system in accordance with a first embodiment of the present invention.

Referring to FIG. 1, a transformer failure analysis system 1 in accordance with a first embodiment is shown for use to monitor and analyze the stability of the current and voltage of a transformer 3 in receiving an AC signal inputted from an AC power source 2, and to further monitor, on the real time, that whether the transformer 3 produces inrush current at the primary winding 32 due to saturation magnetism or fault current induced by the primary winding 32 due to internal failure of the load circuit that is connected to the secondary winding 34. The transformer failure analysis system 1 comprises a controller 10, a sensing device 20, a phase detector 30 and a programmable chip 40.

The controller 10 comprises a trigger circuit 12 and a current-conduction switch 14. The trigger circuit 12 is adapted for inputting a DC signal into the current-conduction switch 14 to have the current-conduction switch 14 turned on for operation. The current-conduction switch 14 is a bidirectional current conduction device having three electrodes, for example, TRIAC (Triode for Alternating Current), and electrically connected to the AC power source 2. When electrically connected, the current-conduction switch 14 conducts the AC power source 2 to the primary winding 32 of the transformer 3. The trigger circuit 12 comprises a control set 120 electrically connected to the programmable chip 40 for receiving therefrom a trigger potential. The circuit structure of the trigger circuit 12 can be made in any ON-OFF switch circuit design for receiving the trigger potential and then sending the DC signal to the current-conduction switch 14.

In actual application, the trigger circuit 12 according to this embodiment is design subject to the consideration of power-saving, comprising a switch 122, a pulse generator 124 and a rectifier 126. The switch 122 is made of a semiconductor device with triode, for example, MOS (metal-oxide semiconductor), having its gate electrically connected to the control set 120. When the switch 122 receives the trigger potential, it is turned on to conduct a first DC voltage 121 to the pulse generator 124, for example, a transformer. At the moment the primary winding of the pulse generator 124 receives the first DC voltage, the secondary winding is induced to provide an pulse current to trigger the gate of the rectifier 126, causing the rectifier 126 to be switched on. The rectifier 126 can be an unilateral current conduction device having three electrodes, for example, SCR (silicon-controlled rectifier). Further, the rectifier 126 is electrically connected with a second DC voltage 123. When triggered by the pulse current, the rectifier 126 conducts the second DC voltage 123 to the secondary winding of the pulse generator 124, enabling the current-conduction switch 14 to receive a stabilized DC signal. Thus, the trigger potential received by the switch 122 is only lasting to trigger the rectifier 126 without continuously conducting the switch 122. By means of having the first DC voltage that is received by the pulse generator 124 be higher than the second DC voltage 123 that is conducted to the rectifier 126, once another trigger potential conducts the first DC voltage to the pulse generator 124 again, the induced potential of the pulse generator 124 is high enough to suppress the rectifier 126 and switch the rectifier 126 off, then the trigger circuit 12 stops outputting the DC signal and cuts off the current-conduction switch 14, thereby effectively saving DC power consumption of the switch 122 and the pulse generator 124.

The sensing device 20 is electrically connected with the current-conduction switch 14 of the controller 10 and the transformer 3 and adapted for sensing the current and voltage of the primary winding 32 of the transformer 3 then outputting a corresponding current signal to the programmable chip 40. In order to protect the operation power the programmable chip 40, the sensing device 20, which can be, for example, a Hall-sensor, has property of high current sensing and low current output, so that the current signal actually received by the programmable chip 40 from the sensing device 20 is lower than the current through the primary winding 32 of the transformer 3.

The phase detector 30 is electrically connected with the AC power source 2 and adapted for detecting the variation of the AC power supply 2 in time sequence, and outputting a phase sensing signal to the programmable chip 10 corresponding to the phase variation of the AC power source 2 in time sequence after current power conversion.

When the transformer 3 encounters a saturation magnetism effect or the internal failure in the load circuit of the secondary winding 34 of the transformer 3, the circuit model that impacts the abrupt current is considered as a series of single degree of freedom (SDOF) systems constructed by mechanic factor of mass, spring, and damping, each of which has different natural frequency. After one impact, the function and the responded amplitude of every single degree of freedom is calculated, and the spectrum thus obtained by linking all responded amplitudes is the shock response spectrum (SRS). Therefore, by means of writing a shock response spectrum analysis program in a personal computer PC to build into the programmable chip 40 and electrically connecting the programmable chip 40 to the sensing device 20, the phase detector 30 and the trigger circuit 12 of the controller 10, as long as receiving the current signal outputted by the sensing device 20, the programmable chip 40 converts the current signal into a time domain voltage signal and then executes a SRS analysis to convert the time domain voltage signal into a frequency domain voltage signal for detecting the inrush current or fault current produced by the primary winding 32 of the transformer. To effectively avoid inrush current of fault current of the transformer 3 from impacting the whole circuit system, the programmable chip 40 runs the SRS analysis immediately after storing two cycles of the time domain voltage signal.

Figure 2:
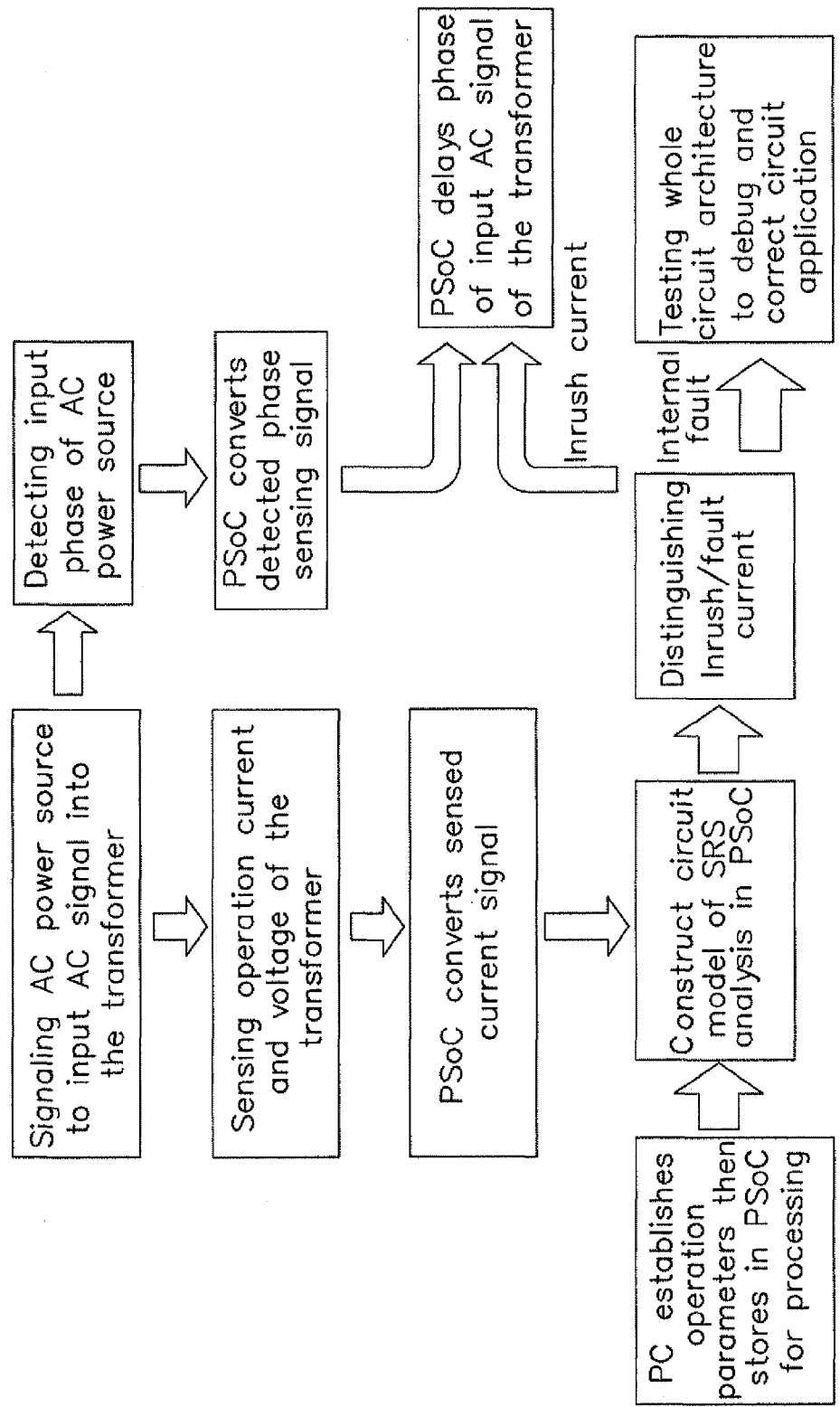
FIG. 2 illustrates the operation flow of the transformer failure analysis system in accordance with a first embodiment of the present invention.

Referring to FIG. 2 and FIG. 1 again, when the controller 10 initially conducts the AC power source 2 to apply an AC signal to the transformer 3, the Hall-sensor of the sensing device 20 senses the flowing current through the transformer 3, and then the programmable chip 40 receives the output current signal from the sensing device 20. When analyzed as detecting an inrush current produced by the primary winding 32 of the transformer 3, the programmable chip 40, according to the phase sensing signal detected by the phase detector 30, provides a first control signal carrying an intermittent trigger potential to the trigger circuit 12 to reset the current-conduction switch 14 of the controller 10 for delaying the phase of the AC signal that is inputted into the primary winding 32 of the transformer 3 relative to the output phase of the AC power source 2. Experimentally, when the relative phase of the inputted angle is 90 degrees, the saturation magnetism of the transformer 3 can be eliminated, thereby effectively suppressing the occurrence of an inrush current upon inputting the AC signal. When analyzed as detecting a fault current induced by the primary winding 32 of the transformer 3, the programmable chip 40 outputs a second control signal to the trigger circuit 12 to stop the trigger circuit 12 from inputting the DC signal into the current-conduction switch 14 of the controller 10, and the controller 10 will be electrically conducted the AC power source 2 with the transformer 3 by the trigger potential only after the operator has tested the whole circuit architecture to debug and correct circuit application and eliminated the internal fault.

Figure 4:
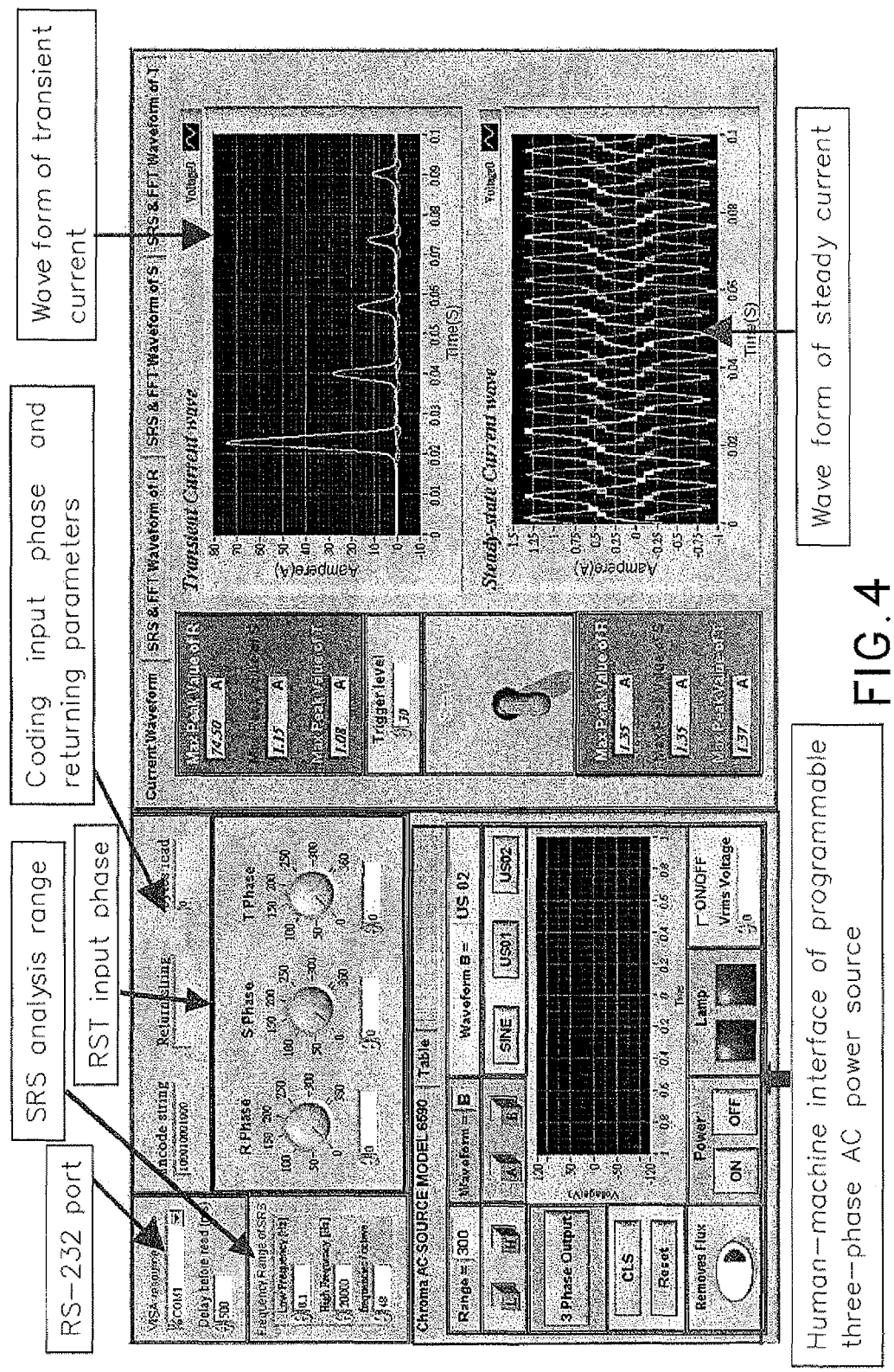
FIG. 4 illustrates the operation interface of the human-machine interface system of the transformer failure analysis system in accordance with the second embodiment of the present invention.
Figure 5:
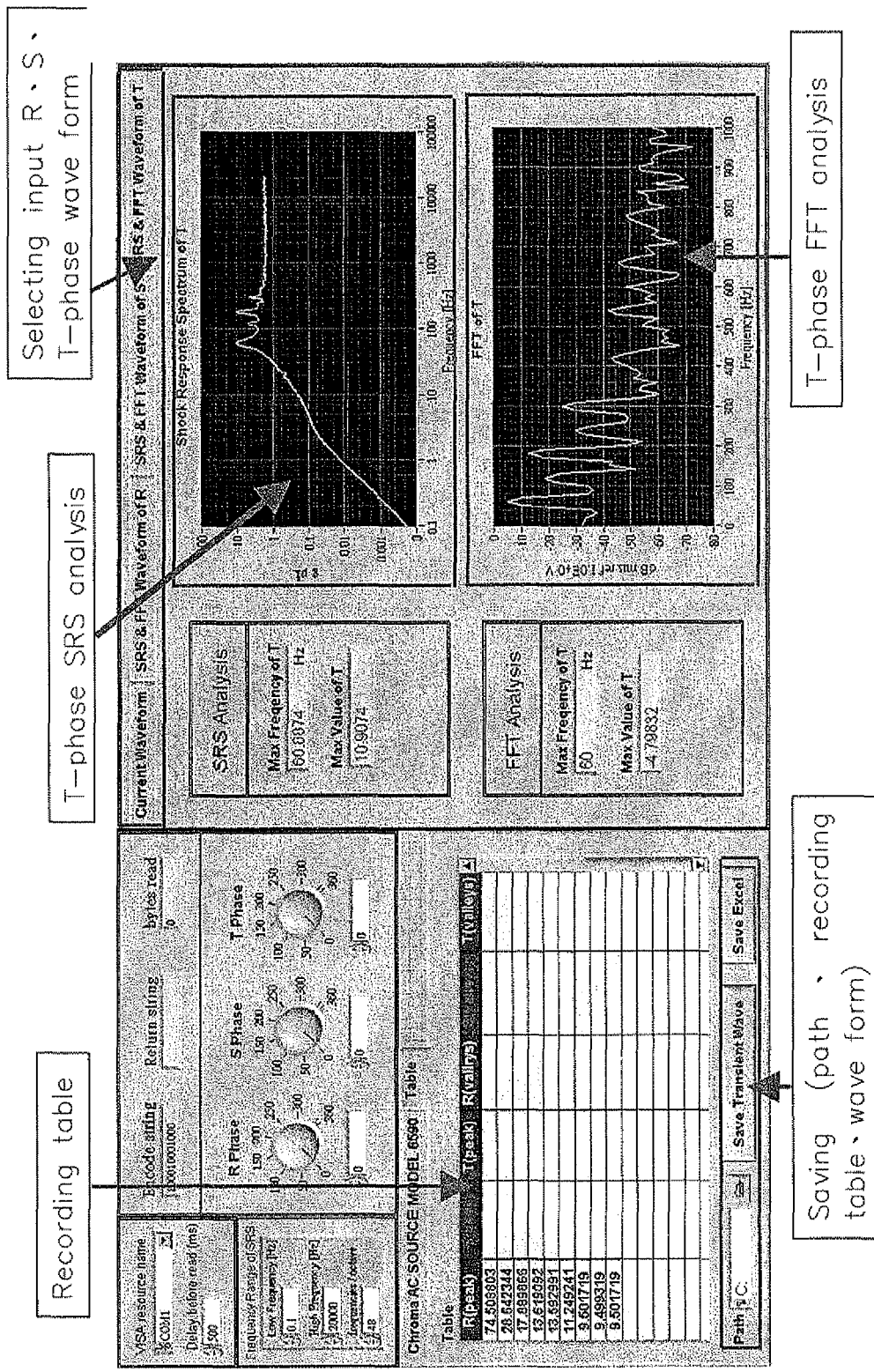
FIG. 5 illustrates the analysis interface of the human-machine interface system of the transformer failure analysis system in accordance with the second embodiment of the present invention.

In order to enable the operator to monitor and control the operation of the transformer 3, a first display device 52 and a second display device 54 that provide an alarm function are respectively electrically connected to the programmable chip 40 and adapted for receiving a respective alarm signal from the programmable chip 40 to display the inrush current or fault current produced by the transformer 3. The programmable chip 40 can also be electrically connected with a third display device 56 of the personal computer displayed as FIG. 4 and FIG. 5, respectively illustrate the operation interface and analysis interface of the human-machine interface system of the transformer failure analysis system based on the programmable chip 40.

Figure 3:
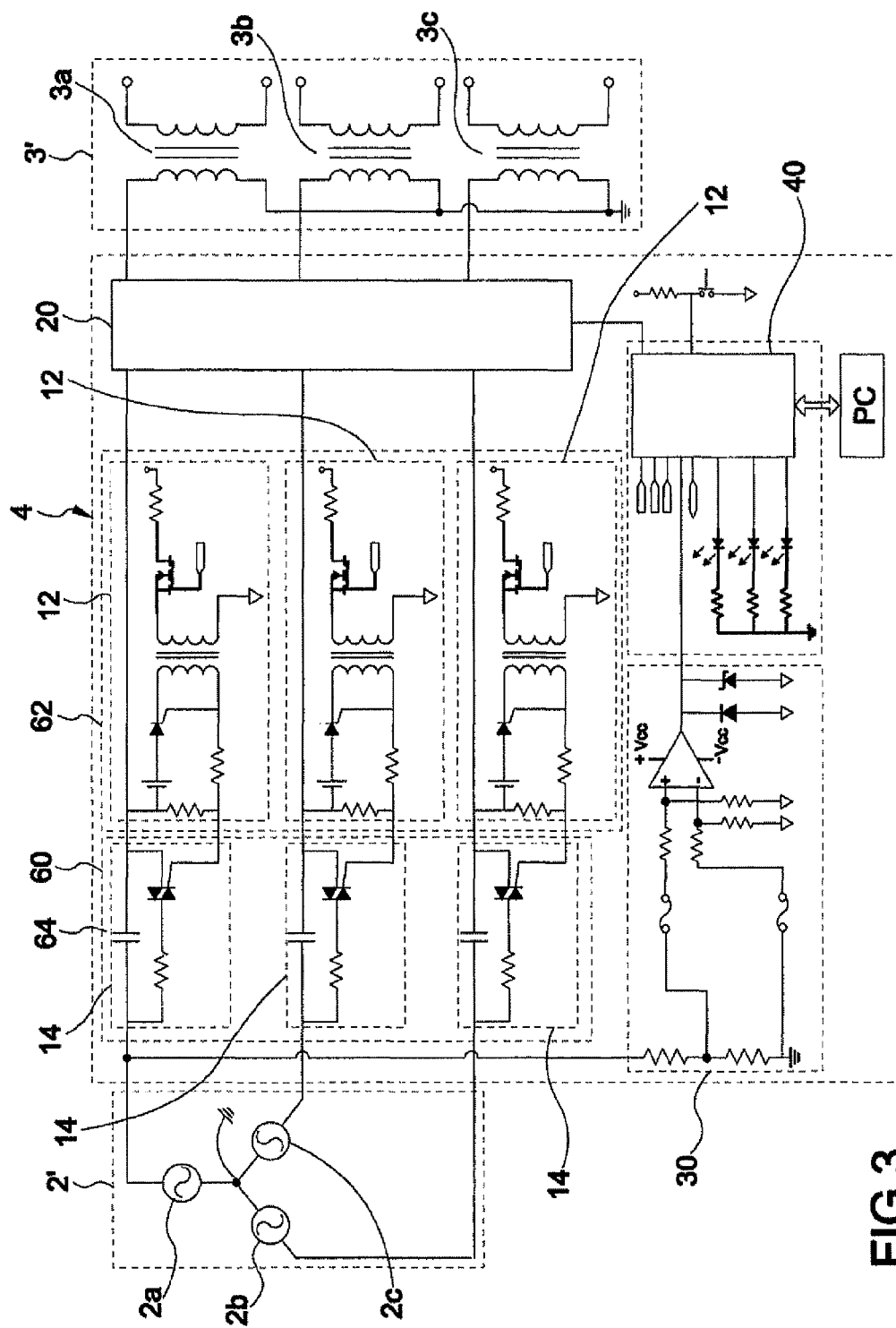
FIG. 3 is a circuit diagram of a transformer failure analysis system in accordance with a second embodiment of the present invention.

Referring to FIG. 3, a transformer failure analysis system 4 in accordance with a second embodiment is shown for monitoring a power signal 2' that outputs three AC power sources 2a, 2b, 2c with relative phases. These three AC power sources 2a, 2b, 2c are phase shifted from one another in 120 degrees, and receivable by three respective transformers 3a, 3b, 3c constructing of a three-phase transformer 3'. The transformer failure analysis system 4 comprises an sensing device 20, a phase detector 30 and a programmable chip 40 that are the same as the components in the aforesaid first embodiment. The transformer failure analysis system 4 further comprises a controller 60. The controller 60 comprises a three-phase trigger circuit 62 consisting of a plurality of trigger circuits 12 that are identical to that used in the aforesaid first embodiment of the present invention, and a three-phase current-conduction switch 64 consisting of a plurality of current-conduction switches 14 that are identical to that used in the aforesaid first embodiment of the present invention. These trigger circuits 12 of the three-phase trigger circuit 62 are adapted for receiving the trigger potential synchronously and separately provided by the programmable chip 40. These current-conduction switches 14 of the three-phase current-conduction switch 64 are respectively electrically connected with the aforesaid three AC power sources 2a, 2b, 2c. When electrically connected, each of the current-conduction switches 14 respectively conducts the respective AC power source 2a, 2b or 2c with the primary winding of the single phase transformer 3a, 3b or 3c of the three-phase transformer 3'.

Figure 6A:
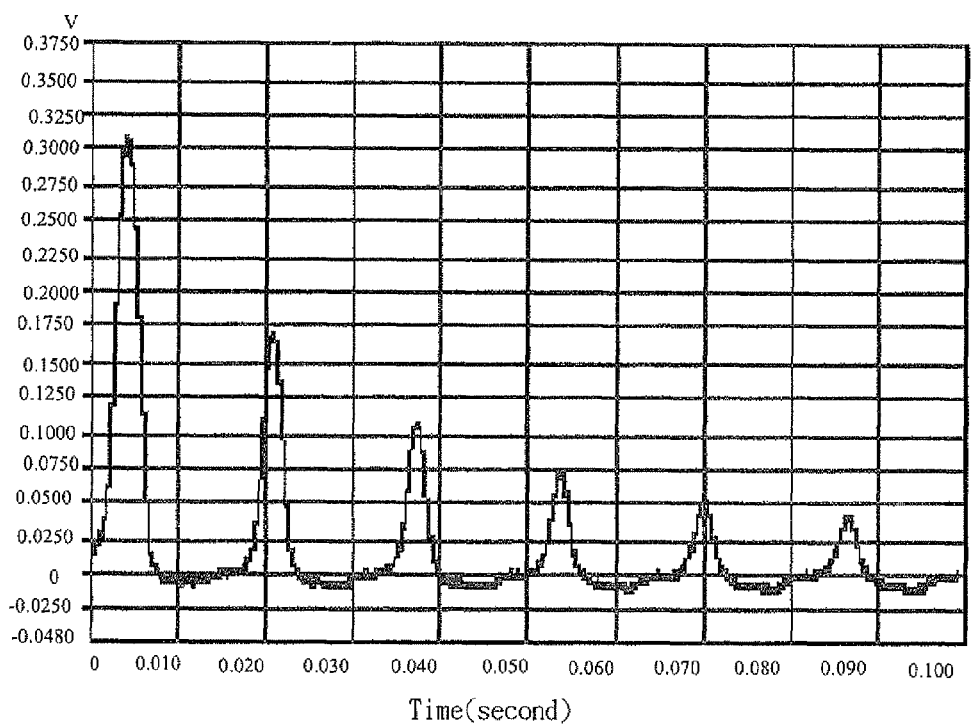
FIGS. 6A~6C illustrates an application example of the human-machine interface system of the transformer failure analysis system in accordance with the second embodiment of present invention upon occurrence of an inrush current where the operation interface displays the waveform of the time-domain voltage signal of FIG. 6A, the analysis interface displays the waveform of the frequency-domain voltage signal of SRS analysis of FIG. 6B and the waveform of the frequency-domain voltage of RFT analysis of FIG. 6C.

When the controller 60 initially conducts the AC power source 2' to apply three AC signals respectively to the three-phase transformer 3', the Hall sensor of the sensing device 20 senses the flowing current through the three-phase transformer 3', and then the programmable chip 40 receives the output current signal from the sensing device 20. Because the three AC power sources 2a, 2b, 2c are phase shifted from one another in 120 degrees, the phase detector 30 simply needs to detect the variation of one AC power source 2a in time sequence for providing a corresponding phase sensing signal to the programmable chip 40. When received the current signal from the sensing device 20, the programmable chip 40 runs the same operation flow as that illustrated in FIG. 2. When the three-phase transformer 3' produces either the inrush current or the fault current, the operation interface corresponding to FIG. 4 will exhibit the time domain voltage signal either shown in FIG. 6A or in FIG. 7A respectively, and the analysis interface corresponding to FIG. 5 will exhibit the signal waveforms of both of the frequency domain voltage signal of shock response spectrum (SRS) analysis (either shown in FIG. 6B or in FIG. 7B respectively) and the Fourier spectrum analysis (either shown in FIG. 6C or in FIG. 7C respectively).

Figure 6B:
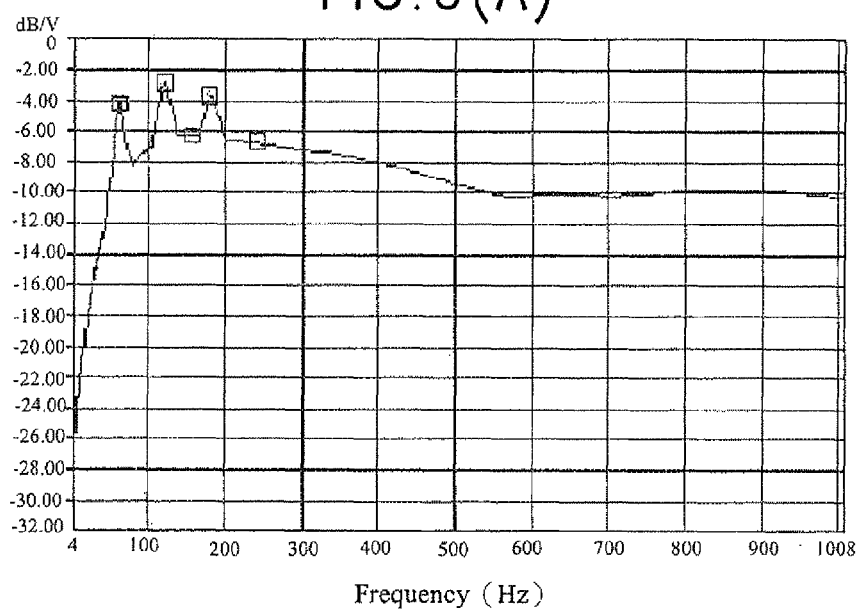
Figure 6C:
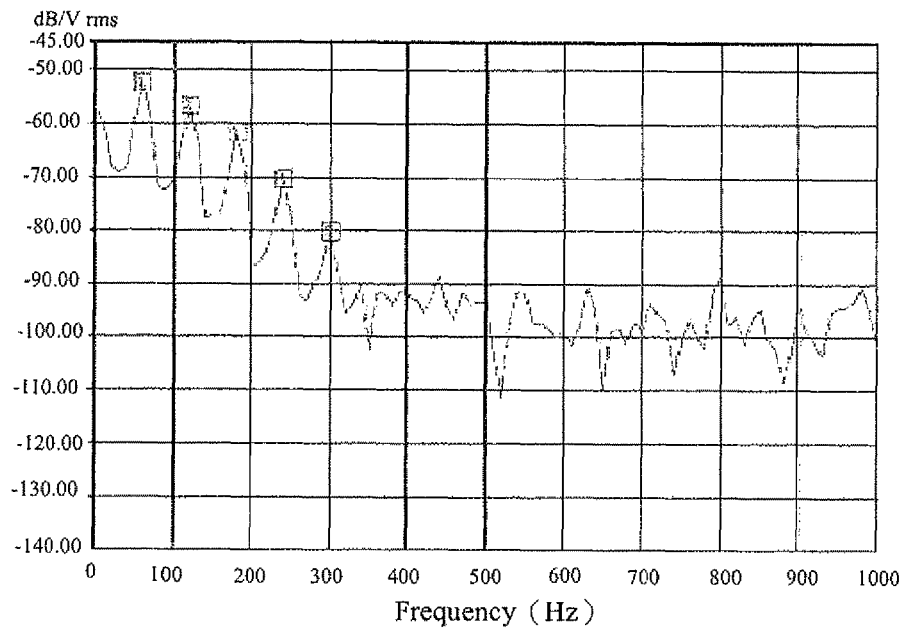
Figure 7A:
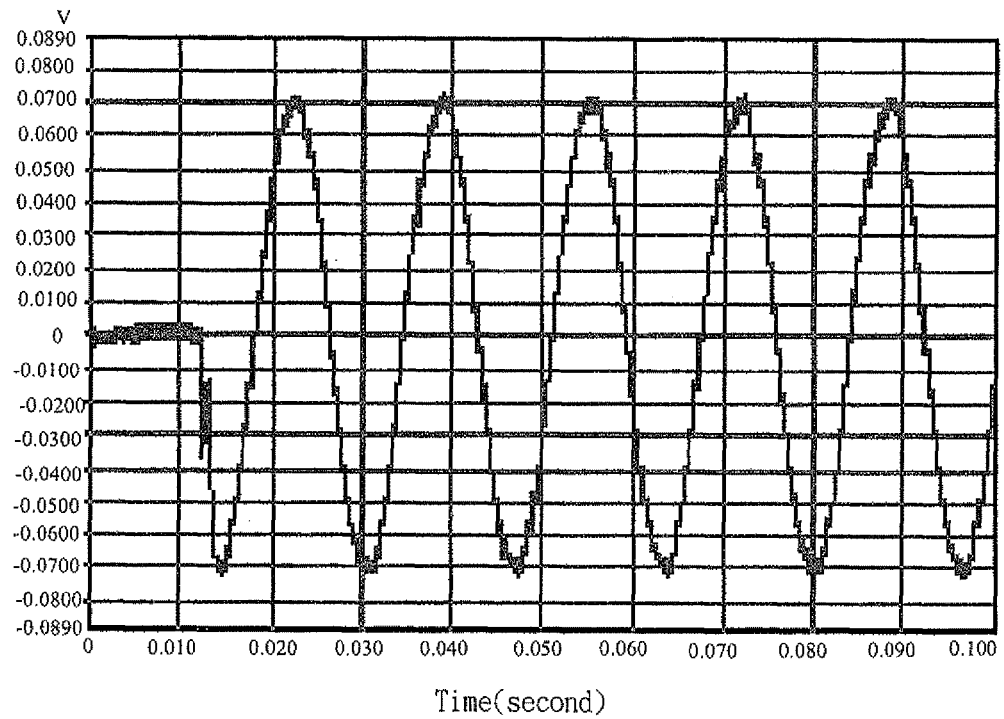
FIGS. 7A~C illustrates an application example of the human-machine interface system of the transformer failure analysis system in accordance with the second embodiment of present invention upon occurrence of a fault current where the operation interface displays the waveform of the time-domain voltage signal of FIG. 7A, the analysis interface displays the waveform of the frequency-domain voltage signal of SRS analysis of FIG. 7B and the waveform of the frequency-domain voltage of RFT analysis of FIG. 7C.
Figure 7B:
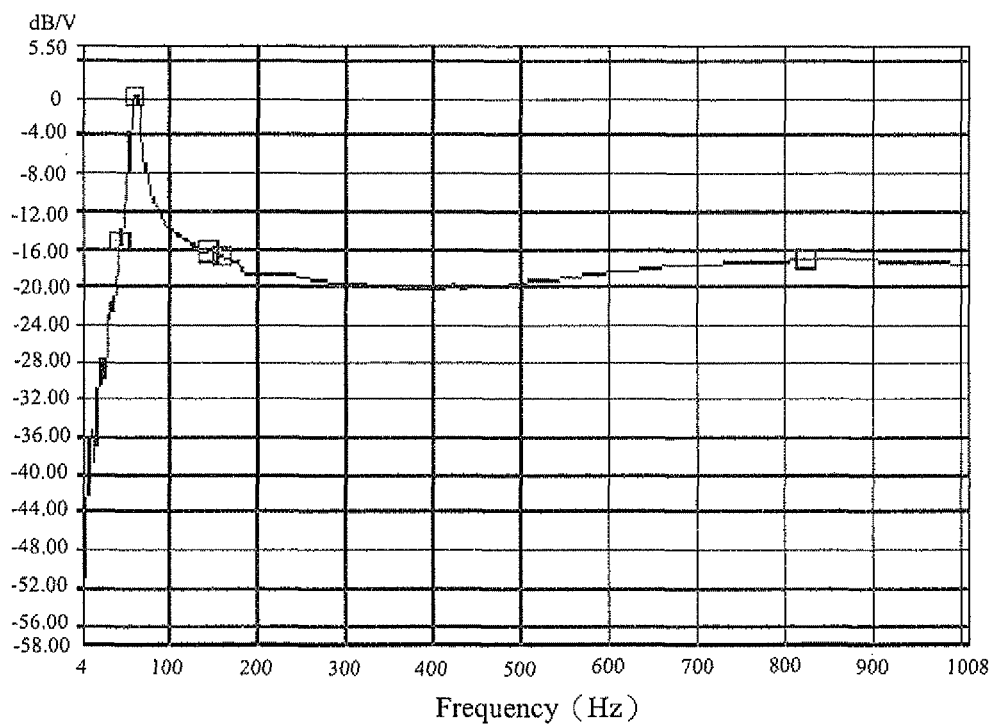
Figure 7C:
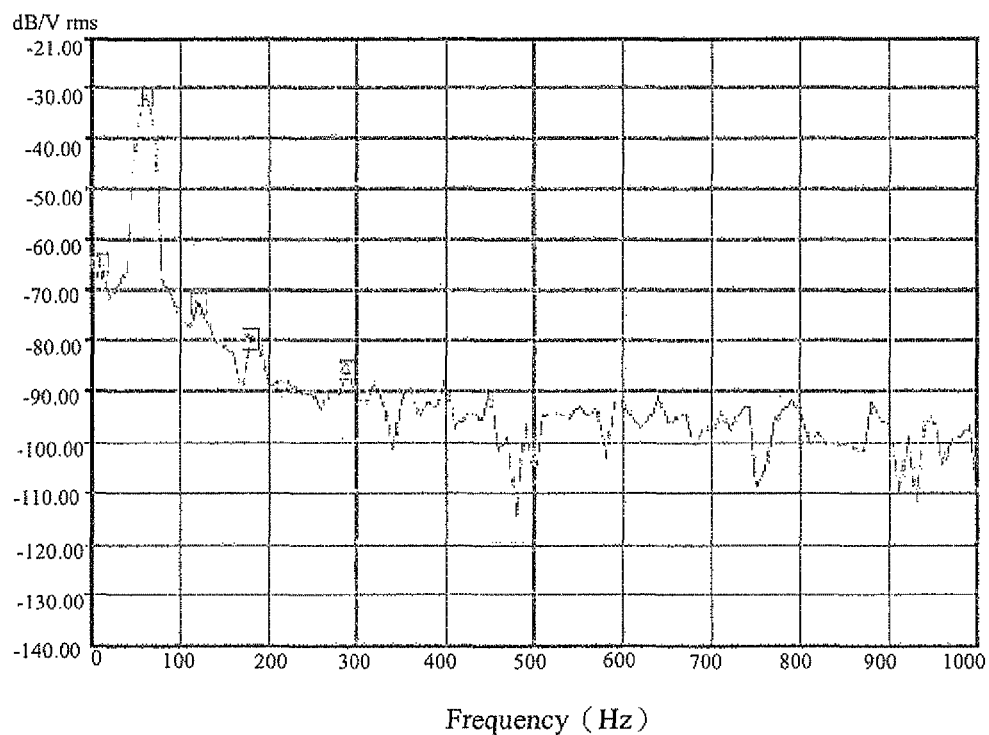

From the shock response spectrum (SRS) analysis shown in FIG. 6B, it is understood that when the fundamental wave of the AC power source is signaling in 60 Hz, the determination of an inrush current is made subject to the presence of a higher response frequency waveform at the second harmonic wave of 120 Hz or the third harmonic wave of 180 Hz than the fundamental wave. However, while monitored by the conventional Fourier spectrum analysis shown in FIG. 6C, the maximum response frequency waveform obtained during the occurrence of an inrush current is at the frequency of the fundamental wave, and it can only exhibit multiple harmonic waves presented as the occurrence of a circuit oscillation similar to the occurrence of the fault current that exhibits more than two harmonic waves in the Fourier spectrum analysis shown in FIG. 7C. When compared with the fundamental wave, the fault current shown in FIG. 7C is minor differing to the inrush current shown in FIG. 6C. When the relative ratio of second harmonic wave is lowered due to change of expanding capacitor or the use of high flux silicon steel in iron core of the transformer, or when the distortion rate of the fault current is increased due to increase of the static capacitance of the corresponding circuit of the transformer, the waveform difference between FIG. 6C and FIG. 7C will be relatively smaller, causing the difficulty of discrimination between a fault current and an inrush current. When using shock response spectrum (SRS) to analyze the fault current as shown in FIG. 7B, a significant difference is seen when compared to the inrush current shown in FIG. 6B, and the maximum response frequency waveform occurs only at the frequency of the fundamental wave. Therefore, when compared to the conventional techniques, the transformer failure analysis system of the present invention facilitates judgment of an inrush current and a fault current.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A transformer failure analysis system adapted for monitoring an input current and voltage of a transformer, comprising:
   a controller, said controller comprising a trigger circuit and a current-conduction switch, said trigger circuit being adapted for providing a DC signal to said current-conduction switch to turn on said current-conduction switch, said current-conduction switch being electrically connected to an AC power source and adapted for transmitting an AC signal to a primary winding of said transformer when turned on;
   a sensing device electrically connected with said current-conduction switch and the primary winding of said transformer and adapted for sensing a current and voltage of the primary winding of said transformer and correspondingly outputting a current signal;
   a phase detector electrically connected with said AC power source and adapted for detecting a variation of said AC power source in a time sequence and correspondingly outputting a phase sensing signal; and
   a programmable chip electrically connected with said sensing device, said phase detector and said trigger circuit of said controller and adapted for receiving the current signal outputted by said sensing device and the phase sensing signal outputted by said phase detector, said programmable chip functioning to convert said current signal into a time-domain voltage signal and then executing a shock response spectrum analysis to convert said time-domain voltage signal into a frequency-domain voltage signal, thus for monitoring an inrush current produced by the primary winding of said transformer and then outputting a corresponding first control signal to said trigger circuit to change a time point of the input of said DC signal into said current-conduction switch.

2. The transformer failure analysis system as claimed in claim 1, wherein said programmable chip outputs a second control signal when detects a fault current produced by the primary winding of said transformer; said second control signal is for cutting off said DC signal from said trigger circuit to said current-conduction switch.

3. The transformer failure analysis system as claimed in claim 1, wherein said first control signal is for delaying the AC signal received from the AC power source and then shifting the phase of the time-domain voltage signal of the primary winding of said transformer.

4. The transformer failure analysis system as claimed in claim 1, wherein said trigger circuit comprises a pulse generator adapted for generating a pulse current to trigger said DC signal.

5. The transformer failure analysis system as claimed in claim 4, wherein said trigger circuit further comprises a rectifier electrically connected with said pulse generator; said pulse current is adapted for turning on said rectifier to provide said DC signal.

6. The transformer failure analysis system as claimed in claim 5 wherein said pulse generator is adapted for receiving a first DC voltage and then outputting said pulse current; said rectifier is adapted for receiving a second DC voltage and then converting said second DC voltage into said DC signal; said first DC voltage is higher than said second DC voltage.

7. The transformer failure analysis system as claimed in claim 1, wherein the current signal outputted by said sensing device is lower than a current flowing through the primary winding of said transformer.

8. The transformer failure analysis system as claimed in claim 2, wherein said programmable chip is electrically connected with a first display device and a second display device for respectively displaying the inrush current and the fault current.

9. The transformer failure analysis system as claimed in claim 8, wherein said programmable chip is further electrically connected with a third display device for displaying the time-domain voltage signal and frequency-domain voltage signal of the primary winding of said transformer.

10. The transformer failure analysis system as claimed in claim 1, wherein said programmable chip runs a shock response spectrum analysis by using two periodic waves of said time-domain voltage signal.

11. The transformer failure analysis system as claimed in claim 1, wherein said transformer is a three-phase transformer; said control device comprises three current-conduction switches adapted for inputting three AC power sources into said three-phase transformer, said three AC power sources being phase shifted from one another in 120 degrees.

12. The transformer failure analysis system as claimed in claim 11, wherein said sensing device is electrically connected with said three current-conducting switches and said three-phase transformer and adapted for outputting said current signal to said programmable chip subject to the current and voltage of said three-phase transformer.

13. The transformer failure analysis system as claimed in claim 12, wherein said programmable chip outputs a second control signal when detected a fault current at said primary winding of said three-phase transformer; said first control signal is for conducting said DC signal from the trigger circuit to said current-conducting switches; said second control signal is for cutting off said DC signal from the trigger circuit to said current-conducting switches.

* * * * *